United States Patent [19]

Yamada

[11] Patent Number: 5,101,377
[45] Date of Patent: Mar. 31, 1992

[54] SEMICONDUCTOR MEMORY DEVICE

[75] Inventor: Toshio Yamada, Sakai, Japan

[73] Assignee: Matsushita Electric Industrial Co., Ltd., Osaka, Japan

[21] Appl. No.: 360,490

[22] Filed: Jun. 2, 1989

[30] Foreign Application Priority Data

Jun. 7, 1988 [JP] Japan .................. 63-139982

[51] Int. Cl.$^5$ .................................................. G11C 13/00
[52] U.S. Cl. ........................................... 365/51; 365/63
[58] Field of Search ............................. 365/51, 63, 72; 357/23.6, 23.7, 59 E, 45

[56] References Cited

U.S. PATENT DOCUMENTS

| | | | |
|---|---|---|---|
| 3,786,444 | 1/1974 | Sly | 365/51 |
| 4,424,579 | 1/1984 | Roesner | 357/45 |
| 4,527,254 | 7/1985 | Ryan et al. | 365/51 |
| 4,888,631 | 12/1989 | Azuma et al. | 357/23.6 |

OTHER PUBLICATIONS

FAM 19.5: A 4Mb DRAM with cross-point Trench Transistor Cell, Ashwin H. Shah et al, Texas Instruments, Inc. 1986 IEEE International Solid-State Circuits Conference, Feb. 21, 1986; pp. 268-269.

Primary Examiner—Joseph A. Popek
Attorney, Agent, or Firm—Stevens, Davis, Miller & Mosher

[57] ABSTRACT

The device has an architecture for improving the degree of integration by an amount corresponding to the reduction rate of memory cells, in which a plurality of memory cells are formed above or below each of a plurality of sense amplifiers.

3 Claims, 8 Drawing Sheets

NUMBER OF DIVISION : 1

NUMBER OF DIVISIONS : 2

NUMBER OF DIVISIONS : 4

| A PLURALITY OF MEMORY CELLS |
|---|
| A PLURALITY OF SENSE AMPLIFIERS |
| A SUBSTRATE |

FIG. 8(a)

| A PLURALITY OF SENSE AMPLIFIERS |
|---|
| A PLURALITY OF MEMORY CELLS |
| A SUBSTRATE |

FIG. 8(b)

SEMICONDUCTOR MEMORY DEVICE

BACKGROUND OF THE INVENTION

The present invention relates to a semiconductor memory device, or more particularly, to a memory architecture for a dynamic random access memory (DRAM).

DRAM integration has been progressing as rapidly as twofold every three years. This high integration of the DRAM has been made possible mainly by the progress of fine processing techniques and increases in chip size. What cannot be overlooked, however, is the fact that the memory cell structure has been improved to realize a high integration beyond the fine processing technique, as is clear when looking back on the history of the DRAM. The first memory cell structure that came on the stage had four MOS transistors required for holding a 1-bit data. After this 4-transistor cell, a 3-transistor cell appeared. Since the 16K-bit DRAM was developed, a one-transistor cell has been used.

In this way, the high integration of a memory cell structure, which had been achieved by reducing the number of elements making up the memory cell in early stages of development, has since been realized mainly by the progress of the fine processing technique and improvement in the memory cell layout in the development stages from a 16K-bit DRAM to a 1M-bit DRAM.

Since the advent of the 1M-bit DRAM, efforts have been concentrated to minimize the surface area by forming capacitances in slots formed vertically in a silicon substrate, thus reducing the size of a memory cell by a three-dimensional method beyond the fine processing technique.

The peripheral circuits such as a sense amplifier required for DRAM construction which depend on the pitches of memory cells, on the one hand, have basically remained unchanged, and have barely followed the high integration of the memory cell by the progress of the fine processing technique and the changes in layout.

Amid the constant improvement in the DRAM memory cell structure, the gap with the peripheral circuits has been widening more and more. As a result, the improvement in peripheral circuits may hold the key to determining the integrity of future DRAMs.

A construction of a conventional semiconductor memory device is shown in FIG. 1.

In FIG. 1, reference numeral 1 designates memory cells for holding 1 bit each, and numeral 2 signal wires for writing a signal into or reading it out of the memory cells 1. In the case of a DRAM, these wires are generally called bit wires. Numeral 3 designates what is generally called word wires. When one of these word wires 3 is selected by a word decoder circuit 21, the data in the memory cell 1 connected to the particular word wire 3 is produced on the bit wire 2 as a signal. Numerals 11 to 15 designate amplifiers for amplifying signals read on the bit wires 2 and connected to respective amplifiers. Numeral 20 designates a selector circuit for applying a signal from a given one of the amplifiers 11 to 15 designated by an external address to an input-output circuit 22.

Apart from this ordinary example applicable to any of DRAM, SRAM and EPROM devices, the problems of a conventional semiconductor memory device will be specifically explained with reference to a DRAM. An ordinary DRAM has a memory cell constructed as shown in FIG. 2(a), and a basic memory array as shown in FIG. 2(b) is configured. Specifically, a signal from each memory cell is applied as a differential signal to a sense amplifier $SA_i$ through a $bit_i$ wire and a $\overline{bit}_i$ wire. The signal from the memory cell is thus amplified by the sense amplifier, produced on data wires D and $\overline{D}$ through a column select switch, and through an input-output circuit, outputted outside of the chip. Let $C_s$ be the capacitance of a capacitor within a memory cell and $C_B$ a stray capacitance of a bit wire. The read signal voltage $\Delta$ is proportional to $C_S/C_B$ as is well known. The higher the signal voltage $\Delta$, the more stable the DRAM operation. For this reason, various efforts have been made to increase the value $\Delta$. $C_S$ has been decreasing with the decrease in memory cell size, and therefore $C_B$ is required to be reduced if only to lessen the decrease in $\Delta$. Specifically, it is necessary to shorten the bit wire length and reduce $C_B$ by reducing the number of memory cells connected to each sense amplifier. For this purpose, the bit wires are required to be divided into more parts if the same number of memory bits is to be secured.

Considering memory arrays shown in FIG. 3 for example, FIG. 3(a) shows an array where the number of bit wire division is one, FIG. 3(b) an array where the number of bit wire divisions is two, and FIG. 3(c) an array where the number of bit wire divisions is four. Comparison between FIGS. 3(a) to 3(c) shows that with the increase in the number of divisions, more sense amplifiers and the like are required. The resulting problems are not only a larger memory occupancy rate $$\left( = \frac{\text{Total sum of memory cell areas}}{\text{Area of memory array (including sense amplifiers)}} \right)$$

but also the impossibility of reducing the chip size in accordance with the reduction in memory cells, indicating that the integrity could not be improved to an extent comparable to the reduction rate of memory cells.

SUMMARY OF THE INVENTION

The object of the present invention is to provide an architecture which permits the peripheral circuit to follow the high integration of a memory cell section, that is, which is capable of improving the integrity to a degree comparable to the reduction rate of memory cells.

In order to achieve the above-mentioned object, there is provided according to the present invention a semiconductor memory device comprising a plurality of memory cells for storing data and a plurality of sense amplifiers for reading and amplifying a signal from the memory cells, wherein a plurality of memory cells are formed upward or downward of each of the sense amplifiers. This configuration according to the invention substantially minimizes the area occupied by the sense amplifiers thereby to improve the integrity by an amount corresponding to the reduction rate of memory cells.

BRIEF DESCRIPTION OF THE DRAWINGS

FIGS. 8(a) and 8(b) are block diagrams showing the arrangement of the memory cells and the sense amplifiers.

DESCRIPTION OF THE PREFERRED EMBODIMENTS

Figure 4:
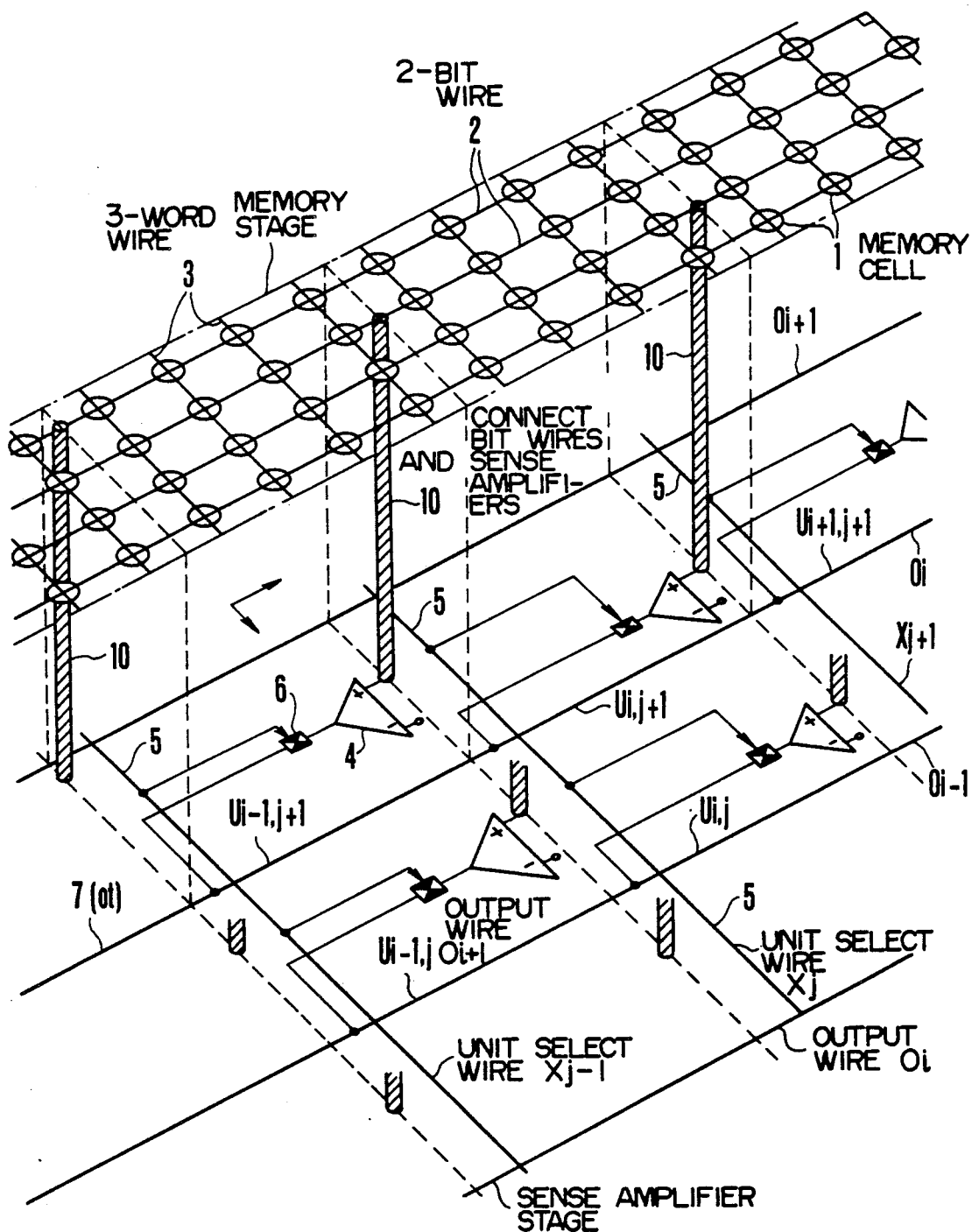
FIG. 4 is a diagram showing a general configuration of a semiconductor memory device according to an embodiment of the present invention.

A general configuration of a semiconductor memory device according to an embodiment of the present invention is shown in FIG. 4. According to the present invention, the semiconductor memory device is realized in double tiers of a sense amplifier stage formed on a substrate and memory stage. In FIG. 4, numeral 1 designates memory cells, numeral 2 bit wires, numeral 3 word wires, numeral 4 sense amplifiers, numeral 5 unit select wires, and numeral 6 transfer gates for producing an output of the sense amplifiers 4 on output lines 7 ($O_i$). Numeral 10 designates through holes in a chip for connecting the memory stage and the sense amplifiers 4. As shown in the drawing, the most conspicuous feature of the present invention resides in that a memory stage is superposed on sense amplifiers 4 whereby the arrangement of the memory cells 1 over the entire surface is made possible in a plane, thereby realizing a high degree of integration. The semiconductor memory device according to the present invention may be produced based on a technical method which is disclosed in "IEDM83, P. 352-355 [MULTILAYER CMOS DEVICE FABRICATED ON LASER RECRYSTALLIZED SILICON ISLANDS]" or "IEDM86, P. 435-438 [FABRICATION TECHNOLOGIES FOR DUAL 4-KBIT STACKED SRAM]".

Figure 5:
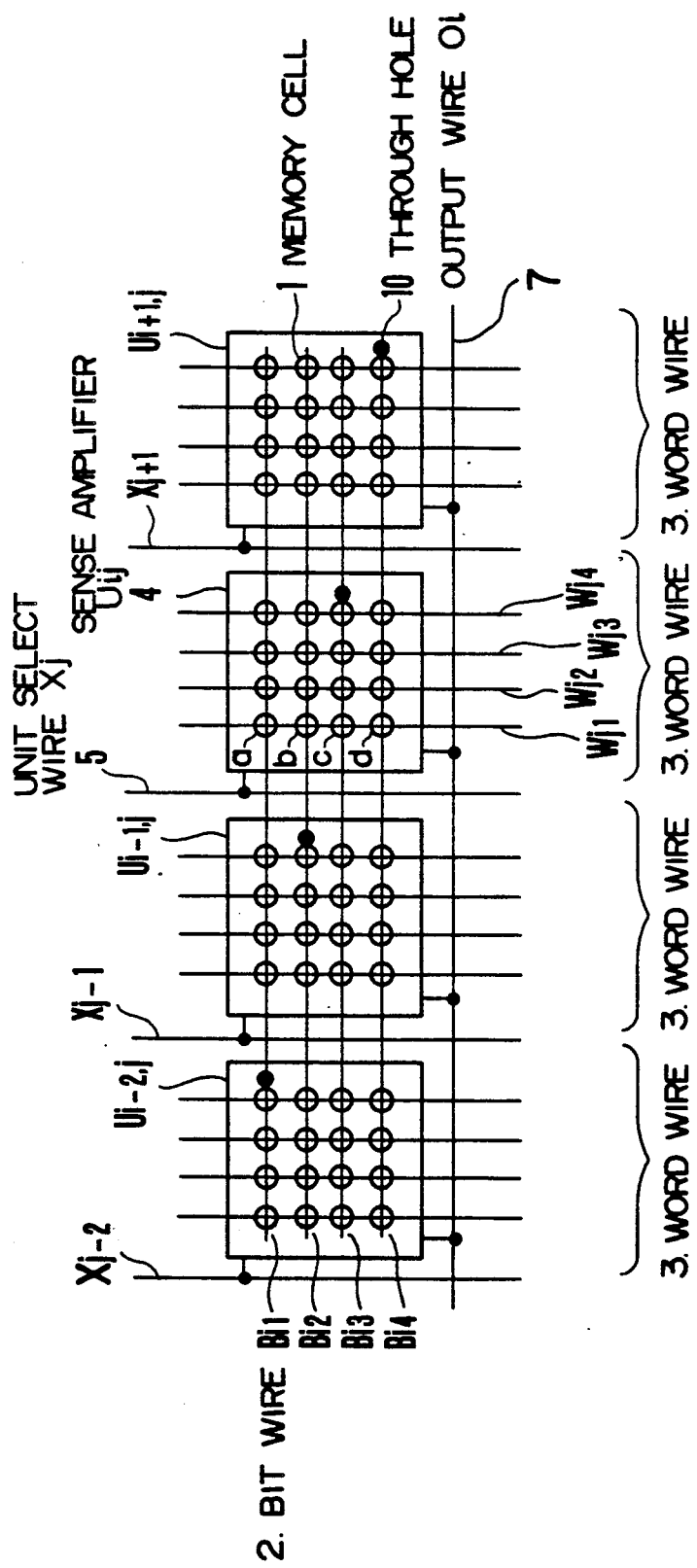
FIG. 5 is a diagram for explaining the FIG. 4 embodiment.

The construction of FIG. 4 is drawn in a plan in FIG. 5 for simplification. The operation of the device will be briefly explained with reference to FIG. 5. When a word wire $W_{ji}$ is selected, the data in the memory cells a, b, c and d in FIG. 5 are read out to bit wires $B_{i1}$, $B_{i2}$, $B_{i3}$ and $B_{i4}$ respectively. The signals thus read out are applied through the connecting through holes 10 and amplified at sense amplifiers $U_{i+1,j}$, $U_{i-1,j}$, $U_{i,j}$ and $U_{i+1,j}$ respectively. When the data in the memory cell C is to be outputted finally the unit select wire $X_j$ transfers an output of the sense amplifier $U_{ij}$ to the output wire $O_i$ and the data is further transferred to the peripheral circuits.

Figure 1:
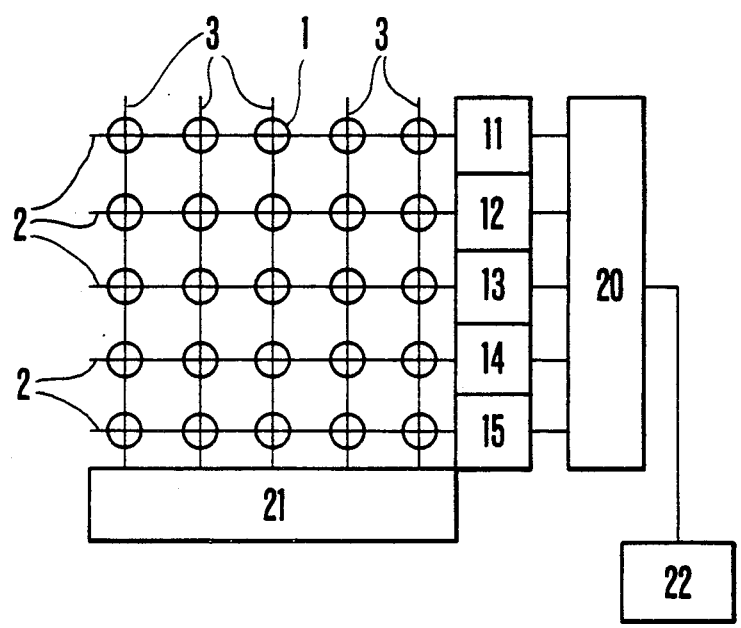
FIG. 1 is a diagram schematically showing a conventional semiconductor memory device.
Figure 2A:
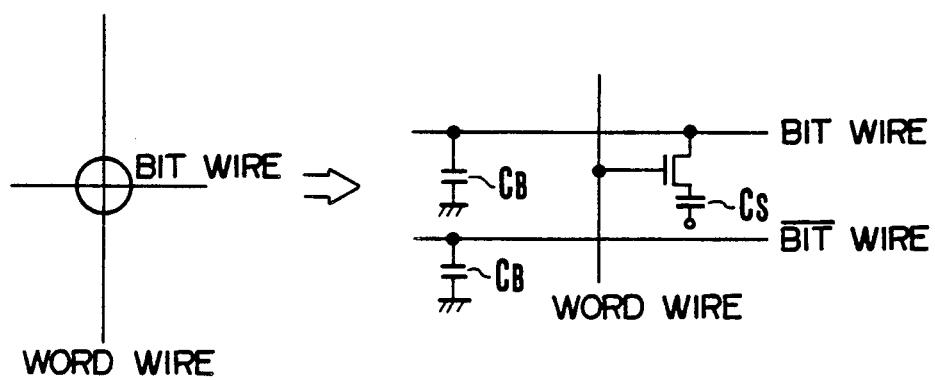
FIG. 2(a) and 2b) are diagrams showing a circuit configuration of the same conventional device.
Figure 2B:
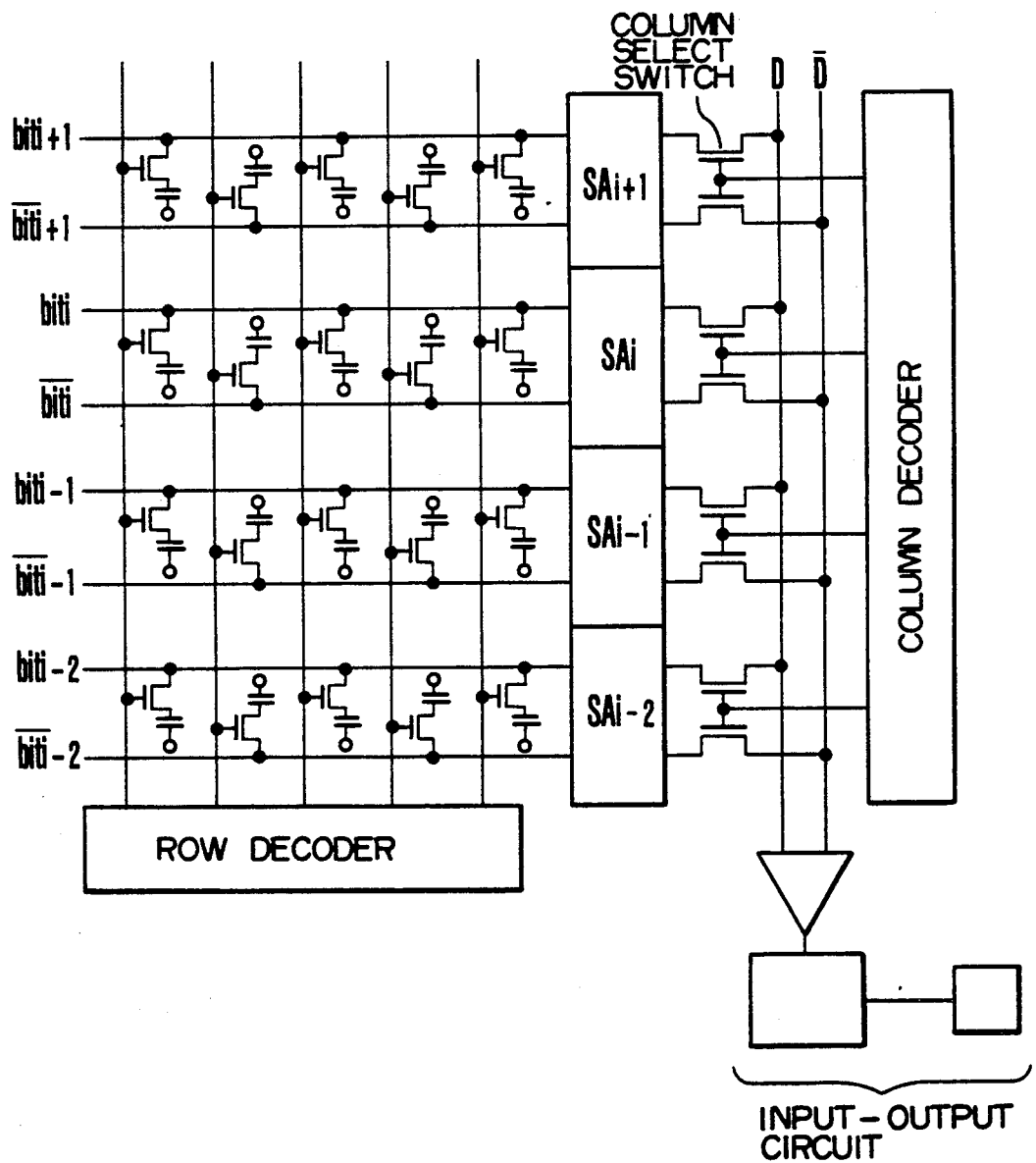
Figure 3A:
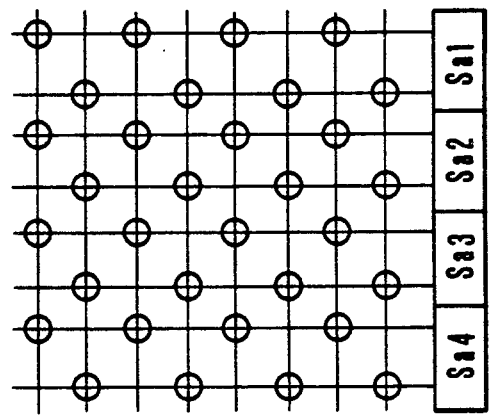
FIGS. 3(a)–3(c) are diagrams explaining a conventional semiconductor memory device in various cases of increased divisions.
Figure 3B:
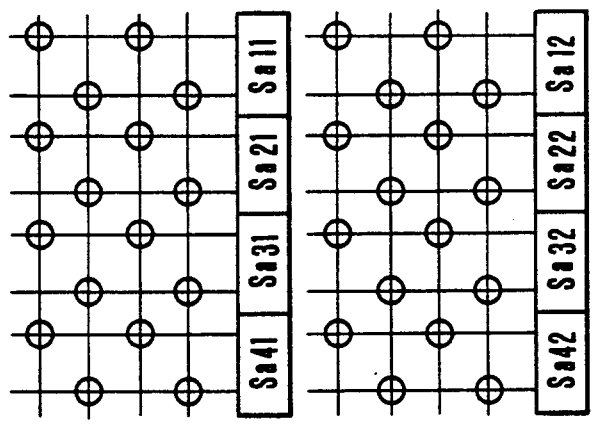
Figure 3C:
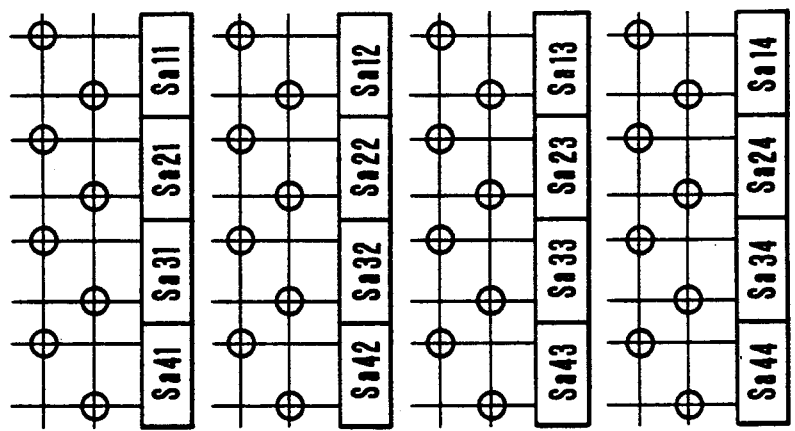
Figure 6:
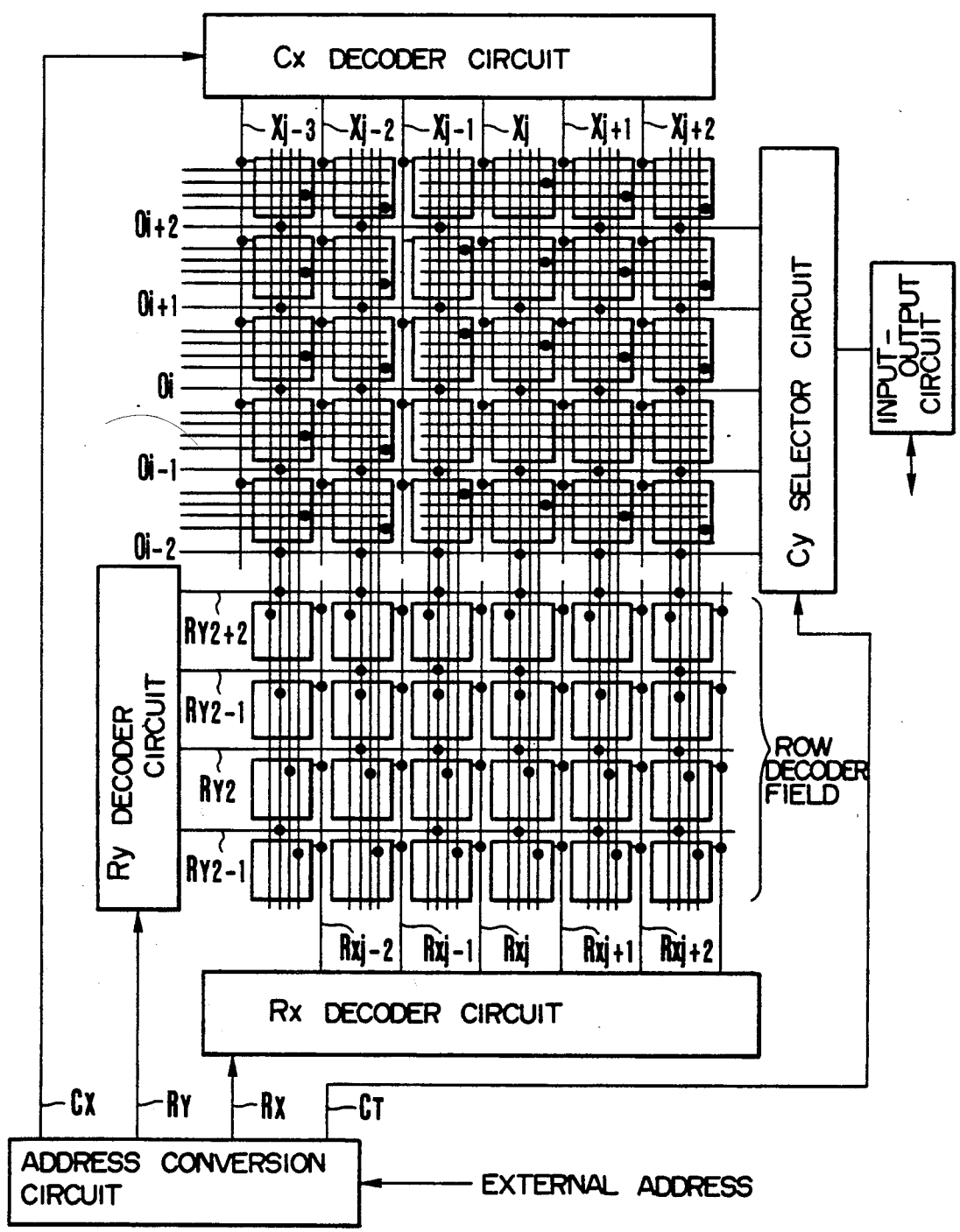
FIG. 6 shows a circuit configuration of the FIG. 4 embodiment.
Figure 7:
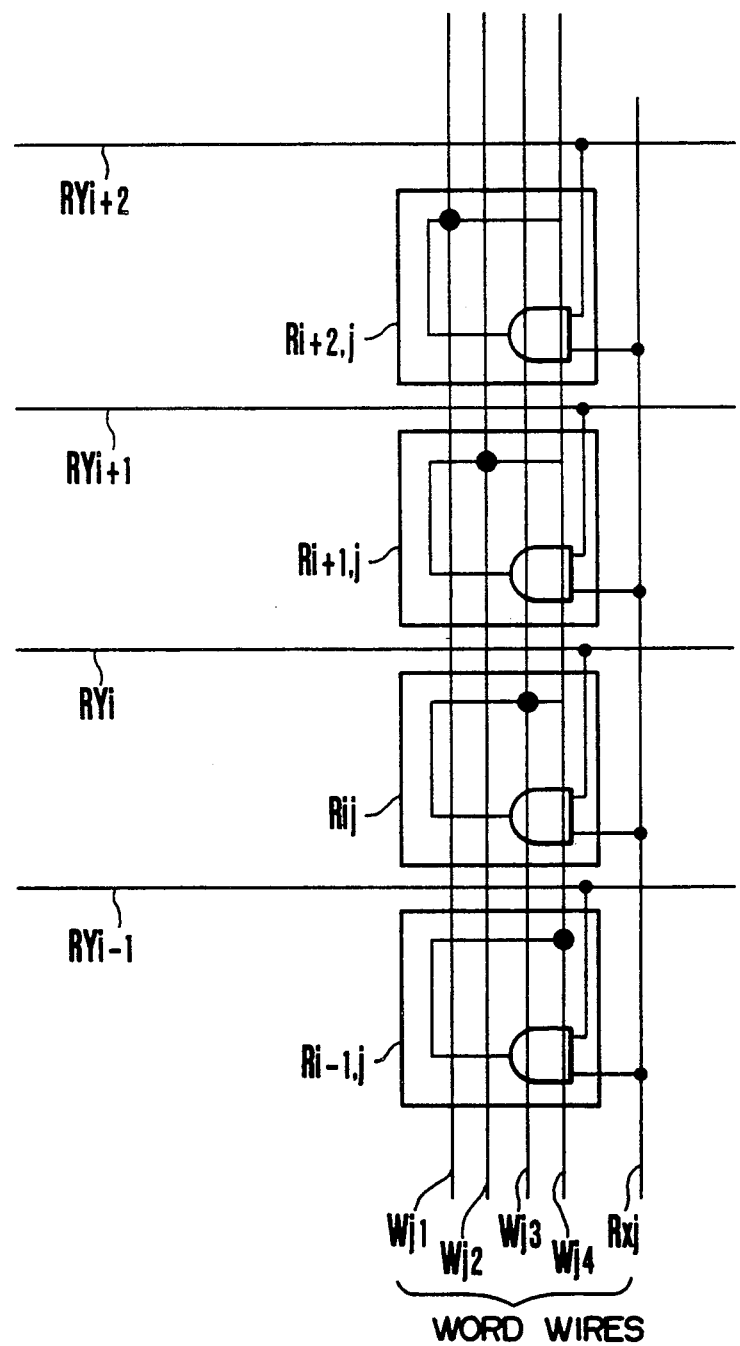
FIG. 7 is a diagram showing a row decoder used with the FIG. 4 embodiment.

A circuit configuration in a broader perspective is shown in FIG. 6. The data in the output wires $O_i$, $O_{i+1}$, $O_{i+2}$, ..., $O_{i-1}$, $O_{i-2}$ and so on are selected by a $C_y$ selector circuit and transferred to an input-output circuit. In FIG. 3, a $C_x$ decoder circuit is for selecting one of the unit select wires (..., $X_{j-3}$, ..., $X_j$, ...). According to the present embodiment, a circuit designated as a row decoder field in FIG. 6 is further used as a circuit for selecting the word wires. This circuit will be explained with reference to FIG. 7. In FIG. 7, characters $W_{j1}$, $W_{j2}$, $W_{j3}$ and $W_{j4}$ designate word wires connected to memory cells. In selecting the word wire $W_{j1}$, for instance, $R_{xj}$ is selected by the $R_x$ decoder, and $R_{yi+2}$ by the $R_y$ decoder circuit. The row decoder unit $R_{i+2}$ is activated by $R_{xj}$ and $R_{yi+2}$ thereby to activate the word wire $W_{ji}$.

FIG. 8(a) shows a semiconductor memory device comprising a plurality of sense amplifiers, with a plurality of memory cells superposed on the upper surface of the sense amplifiers. FIG. 8(b) shows a semiconductor memory device comprising a plurality of sense amplifiers, with a plurality of memory cells superposed on the lower surface of the sense amplifiers.

A row decoder circuit is used by reason of the fact that with the increase in the degree of integration of memory cells, the pitch of the word wires is reduced, thereby making it increasingly difficult to form a decoder circuit within the pitch. The word decoder configuration according to the present embodiment permits the pitch of row decoders regardless of the size of memory cells or the pitch of word wires ($W_{j1}$ to $W_{j4}$).

As shown in FIGS. 4 to 7, explanation has been made above with reference to a case in which a memory of 16 ($=4 \times 4$) bits is superposed on each sense amplifier. The present invention is of course not limited to such a configuration, but may be embodied in a configuration comprising a greater number of memory cells on each sense amplifier. Further, the present embodiment is realizable with many types of devices including a MOS transistor, bipolar transistor or the like for the sense amplifiers and decoders without departing from the spirit of the invention.

It will thus be understood from the foregoing description that according to the present invention the chip size is reduced to a degree corresponding to the reduction rate of a memory cell. Further, if memory cells are superimposed on sense amplifiers, the device is less affected by αrays which often pose a problem in DRAMs. Further, according to the present invention, the sense amplifiers and the decoder circuits may be configured of bipolar GaAs or the like, thus realizing a high-speed semiconductor memory device.

I claim:

1. A semiconductor memory device comprising:
an array of sense amplifiers; and
an array of memory cells superposed on a selected surface of said array of sense amplifiers, wherein said superposed array of memory cells and said array of sense amplifiers are formed on a substrate and each sense amplifier in said array of sense amplifiers is connected to a bit line in said superposed array of memory cells through a connection through hole in said substrate.

2. A semiconductor memory device comprising:
an array of sense amplifiers;
a plurality of output lines each connected to receive output signals from plural ones of said sense amplifiers;
an array of selection circuit connected to said output lines for selectively enabling said output signals to be provided to said output lines; and
an array of memory cells superposed on a selected surface of said array of sense amplifiers, wherein each memory cell is connected to a single line which in turn is connected to at most one amplifier of said array of sense amplifiers and wherein said superposed memory cells and said array of sense amplifiers are formed on a substrate.

3. A semiconductor memory device comprising:
an array of sense amplifiers;

a plurality of output lines;
an array of selection circuits; and
a plurality of memory cells superposed on a selected surface of said sense amplifiers, wherein each memory cell is connected to a signal line which in turn is connected to at most one amplifier of said array of sense amplifiers and an output signal of a sense amplifier selected by a selection circuit is produced on an output line, wherein said superposed memory cells and said array of sense amplifiers are formed on a substrate.

* * * * *